(12) United States Patent
Yu et al.

(10) Patent No.: US 6,571,485 B1
(45) Date of Patent: Jun. 3, 2003

(54) STRUCTURE OF AN OVERLAY MARK AND ITS DOSIMETRY APPLICATION

(75) Inventors: Cheng-Hung Yu, Hsinchu (TW); Chi-Liang Kuo, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/998,278

(22) Filed: Nov. 30, 2001

(51) Int. Cl.[7] .............................................. G01D 21/00
(52) U.S. Cl. .................................... 33/645; 414/936
(58) Field of Search .......................... 33/645, 533, 613, 33/297, 298; 414/935–941

(56) References Cited

U.S. PATENT DOCUMENTS

| | | | | |
|---|---|---|---|---|
| 4,356,223 A | * | 10/1982 | Iida et al. ...................... | 33/613 |
| 5,504,999 A | * | 4/1996 | Barr .............................. | 33/645 |
| 5,557,855 A | * | 9/1996 | Hwang .......................... | 33/613 |

* cited by examiner

*Primary Examiner*—Christopher W. Fulton
(74) *Attorney, Agent, or Firm*—Charles C. H. Wu; Wu & Cheung, LLP

(57) ABSTRACT

A structure, a fabrication method and an application of an overlay mark. The overlay mark structure has an outer mark and an inner mark. The outer mark encloses a cross area that has two central axes. The inner mark has four strip patterns arranged in two central axes and extend outwardly towards four directions from the central part of the closed cross area.

13 Claims, 6 Drawing Sheets

STRUCTURE OF AN OVERLAY MARK AND ITS DOSIMETRY APPLICATION

BACKGROUND OF THE INVENTION

1. Field of the Invention

The invention relates in general to a structure of an overlay mark and its dosimetry application. In particular, this invention relates to a structure of an overlay mark that can prevent damage caused by chemical mechanical polishing process due to the design of the inventive structure surpasses the conventional structure and corresponds to the dosimeters of X,Y directions, thus, enhances measurement accuracy and analysis method of the overlay error.

2. Description of the Related Art

In addition to the control of critical dimension (CD), factors for a successfull photolithography process on a wafer include alignment accuracy (AA). Therefore, the measurement of accuracy, that is, the measurement of overlay error is crucial to the semiconductor fabrication process. An overlay mark is used as a tool for measuring overlay error and to determine whether the photoresist pattern is precisely aligned with the previous wafer layer on a wafer after a photolithography process.

FIG. 1 is a top view of a wafer that illustrates positions of conventional overlay marks.

In FIG. 1, after the wafer 100 is formed, the wafer 100 is sawed along scribe lines 104 into a plurality of chips or dies 102. Normally, the overlay marks 106 are located on the scribe lines 104 at the four corners of the edge of each chip 102 to measure whether the photoresist pattern is aligned with the previous wafer layer in the fabrication process.

FIG. 2 is a cross-sectional view cutting along the line I-I' of FIG. 1. A part of the structure of the overlay mark and the neighboring chip is shown. The overlay mark is applied to an interconnection fabrication process, which is further described as follows.

In FIG. 2, a metal layer 202 is formed in the substrate 200. A dielectric layer 205 with a via hole 206 and a trench 207 therein is formed on the substrate 200. The via hole 206 has a narrow width. A metal layer 204 is formed over the dielectric layer 205 to completely fill the via hole 206, but to cover only a surface portion of the trench 207. A chemical mechanical polishing process is performed to remove the metal layer 204 that is formed out of the via hole 206 and the trench 207. The dielectric layer 205 is thus exposed that is the dielectric layer 205 is used as a stop layer to form a plug within the via hole 206. A metal layer 208 is formed on the dielectric layer 205 to fill the trench 207. Because the trench 207 is sufficiently wide, therefore, the metal layer 208 over the trench 207 has a recess 211. Due to the recesses 211 on the metal layer 208, scribe lines are formed on the metal layer 208.

A number of processes such as photoresist coating, an exposed process and a photolithgraphic process are carried out to form a patterned photoresist layer 210 on the metal layer 208. Therefore, a region for forming conductive wires in the metal layer 208 is exposed. A photoresist pattern 210a is formed between the scribe lines and is combined with the recess 211 as an overlay mark 212 for an accurate measurement.

FIG. 3 shows a top view of a conventional structure of an overlay mark.

Referring to FIGS. 2 and 3, FIG. 3 is a top view of an overlay mark 212 formed by a combination of the recess 211 and the photoresist pattern 210a. A conventional overlay mark 212 includes an outer mark 302 and an inner mark 304. The outer mark 302 comprises four recesses 211 as shown in FIG. 2, while the inner mark 304 comprises the photoresist patterns 210a that constructs another rectangle. The outer mark 302 embraces the inner mark 304. The overlay mark 212 is located on the scribe lines at four corners of each chip to measure whether the photoresist pattern is precisely aligned with the previous layer.

FIG. 4 illustrates a cross section taken along a cutting line II-II' of FIG. 3.

Referring to FIGS. 3 and 4, the recesses 211 in FIG. 4 correspond to the outer mark 302 in FIG. 3, and the photoresist pattern corresponds to the inner mark 304.

FIG. 5 shows the signal waveform of the overlay mark as shown in FIG. 4.

Referring to FIGS. 4 and 5, the peak signals of the recesses 211 in FIG. 4 are denoted as 502a and 502b in FIG. 5, and the peak signals of the photoresist pattern 210a are denoted as 506a and 506b in FIG. 5. Using the conventional overlay mark to measure the alignment accuracy, the peak signals 502a, 502b of the recesses are read first. A mean value 504 of the peak signals 502a and 502b is obtained. A mean value 508 of the peak signals 506a and 506b is then obtained after being read. The difference between the mean values 504 and 508 is calculated as the overlay error. If the overlay error is larger the acceptable deviation, the alignment between the photoresist pattern and the wafer does not reach the required accuracy. Consequently, the photoresist has to be removed, and the photolithography process has to be repeated until the overlay error is no larger than the acceptable error.

However, after chemical mechanical polishing, the quality of the conventional outer mark of the overlay mark is affected or even damaged due to the factors such as a polishing rate deviation, a slurry corrosion, a density of patterns on the wafer and the polishing deviation between the wafer center and edge. Further, the grain of the metal layer is an important factor for affecting on the accuracy of the overlay mark because if the size of the grain is too big, it will affect the measuring signal, leading to a poor measurement of signal profile of the peak signal is obtained. The measurement result is thus seriously affected because the distance between the outer marks 302 (that is, the recesses 211) of the conventional overlay mark is too long. That is, because the distribution of the recesses 211 is too scattered, and because the scattered structure, the damage caused by chemical mechanical polishing is not withstood. The chemical mechanical polishing performed after formation of the metal via, especially the copper damascene, plays an important role for the subsequent process due to the integrity of the overlay mark. This is because the problems of stability, slurry anti-corrosion and diffusion cause a more serious effect to copper than other metal such as tungsten.

FIG. 6 shows the method for measuring the overlay error using the conventional overlay mark.

Referring to FIG. 6, while measuring the overlay error using the conventional overlay mark, the X-directional deviation is measured along a straight line 310 in X-direction of the overlay mark 212. A Y-directional deviation is further measured along a straight line 312 in the Y-direction of the overlay mark 212. When all the overlay marks 212, which are being set in the scribe lines are measured using this method, whether the photoresist pattern and the previous wafer layer on the chip are precisely aligned can be calculated according to the X- and Y-directional deviations.

However, one conventional overlay mark 212 can only measure one X- and one Y-directional deviations. If the outer mark 302 is damaged during the chemical mechanical polishing process, the X- or Y-directional deviation cannot be measured, and the alignment accuracy cannot be obtained correctly.

SUMMARY OF THE INVENTION

The invention provides a structure and a fabrication method of an overlay mark. The probability of damaging the overlay mark by chemical mechanical polishing process is reduced.

The invention further provides an overlay mark structure, and the measure and analysis method thereof to enhance the accuracy for measuring the overlay error.

The structure of the overlay mark provided by the invention includes an outer mark and an inner mark. The outer mark encloses a closed cross area which comprises two central axes. The inner mark is made of four strip patterns arranged in the central axes and extends outwardly towards four directions from a central part of the closed cross area.

The invention further provides a method of measuring overlay error. An overlay mark is provided. The overlay mark comprises an outer mark and an inner mark. The outer mark encloses a closed cross area that comprises two central axes. The inner mark is arranged in the central axes and includes two X-directional strip patterns and two Y-directional strip patterns extending outwardly from a central part of the cross area. An X-/Y-directional deviation along the X-/Y-direction is measured. An X-/Y-directional straight line cuts across a Y-/X-directional extension area of the closed cross area and one of the Y-/X-directional strip patterns.

The invention also provides a method for analyzing the overlay error factors. An overlay mark with an outer mark and an inner mark is firstly provided. The outer mark encloses a closed cross-area with two central axes. The inner mark includes two strip patterns arranged in an X-direction and two strip patterns arranged in a Y-direction. A first X-/Y-directional deviation is measured along a first X-/Y-directional straight line that cuts across one of Y-/X-directional extension areas of the closed cross area and one of the Y-/X-directional strip patterns. A second X-/Y-directional deviation is measured along a second X-/Y-directional straight line that cuts across the other Y-/X-directional extension area of the closed cross-area and the other Y-/X-directional strip pattern. A plurality of overlay error factors can be obtained from first X-/Y-directional deviations and the second X-/Y-directional deviations (four deviations). The overlay error factors include a displacement error and a reticle rotation (RR) error inducing by a position of a photoresist layer.

The overlay mark provided by the invention includes a reinforced structure that effectively withstands the chemical mechanical polishing process that can damage the outer mark during interconnection fabrication process. Therefore, the probability of damage caused by chemical mechanical polish is greatly reduced.

The inner mark of the overlay mark of the present invention is defined by the photoresist layer. In general, the signal transmission is very good, therefore an unstable problem due to measure two directions on one side only to form one mark shall not be concerned. In the contrary, measuring the directions of the two X,Y points of one single set provides twice information than the convention method, and it can increase the accuracy of the calculation and the sample.

In addition, while using the overlay mark and measurement method of the invention, the accuracy of measurement of the overlay error is enhanced.

Furthermore, only one overlay mark is required to obtain the reticle rotation error in the invention.

Both the foregoing general description and the following detailed description are exemplary and explanatory only and are not restrictive of the invention, as claimed.

DESCRIPTION OF THE PREFERRED EMBODIMENTS

Figure 1:
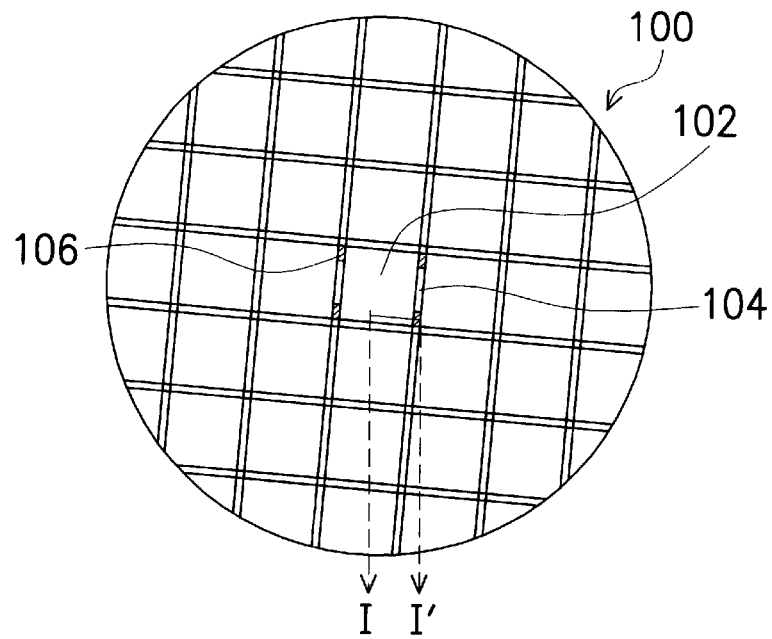
FIG. 1 is a top view of a wafer, on which the position of a conventional overlay mark is illustrated.
Figure 2:
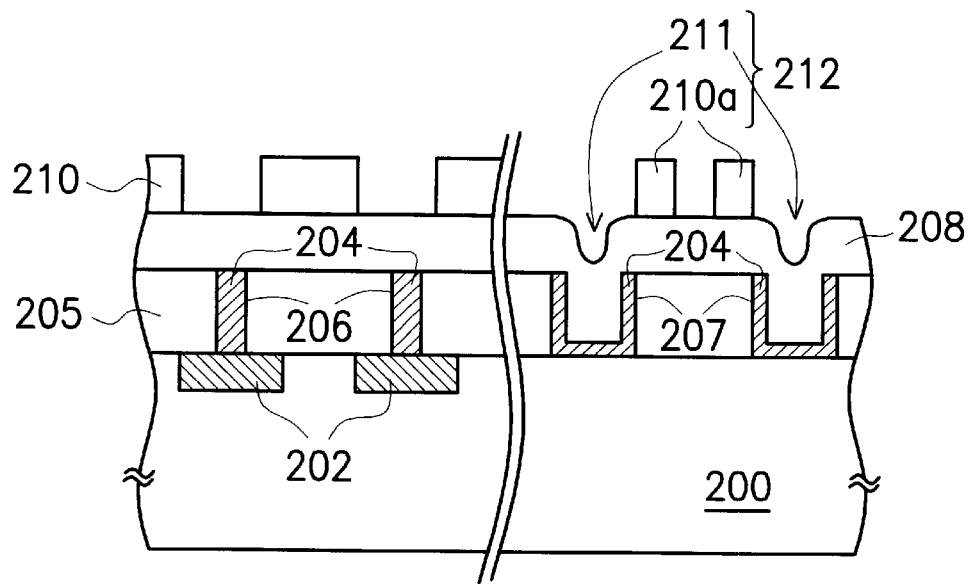
FIG. 2 is a cross-sectional view cutting along the line I-I' of FIG. 1 that shows the structure of a part of the conventional overlay mark and the neighboring wafer, with the overlay mark applied to an interconnection fabrication process.
Figure 3:
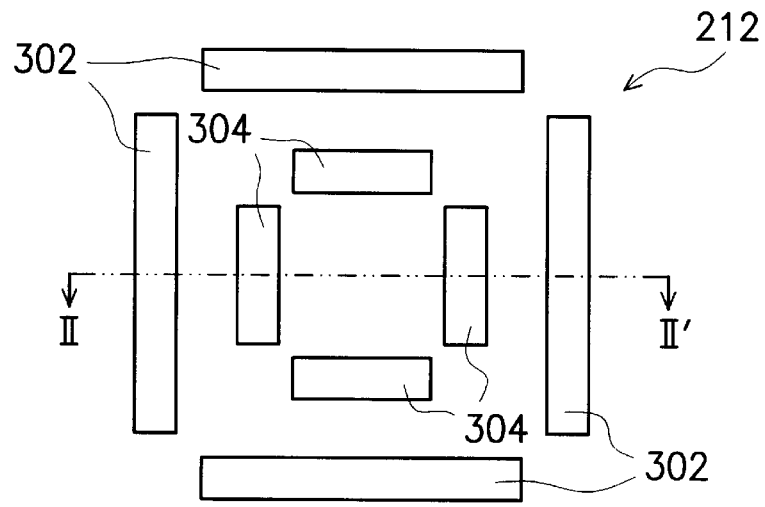
FIG. 3 is a top view of a conventional overlay mark.
Figure 4:
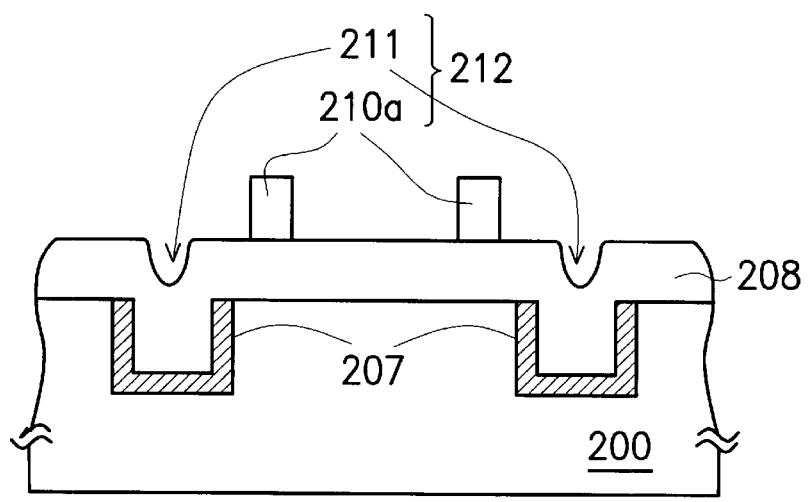
FIG. 4 is a cross-sectional view of the overlay mark cutting along the line II-II' of FIG. 3.
Figure 5:
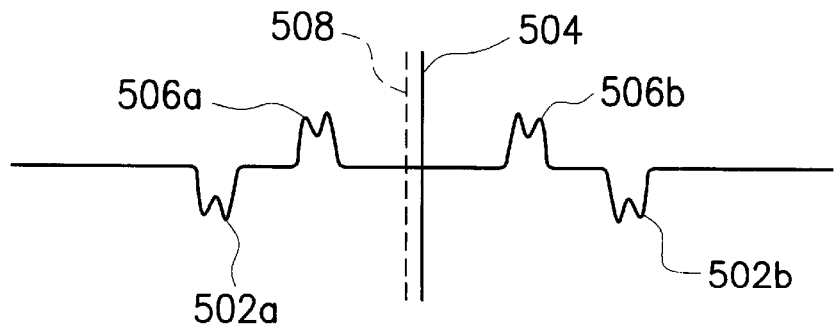
FIG. 5 is a signal waveform of the conventional overlay mark in FIG. 4.
Figure 6:
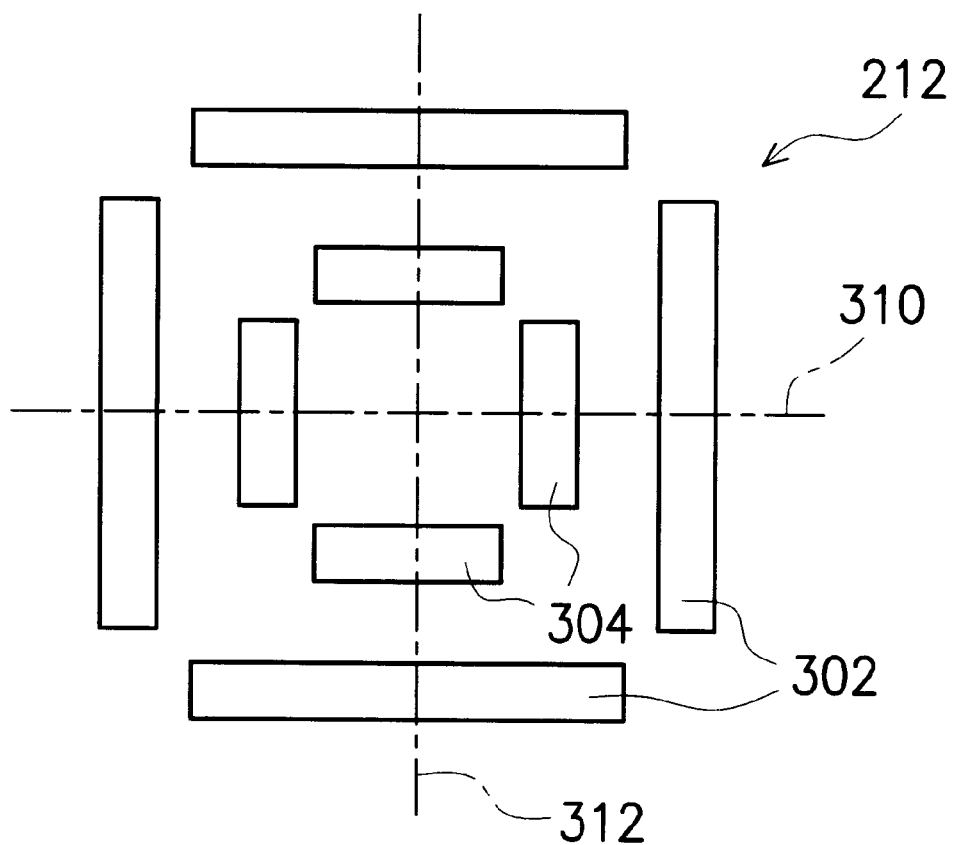
FIG. 6 shows a measurement method of an overlay error using the conventional overlay structure.
Figure 7:
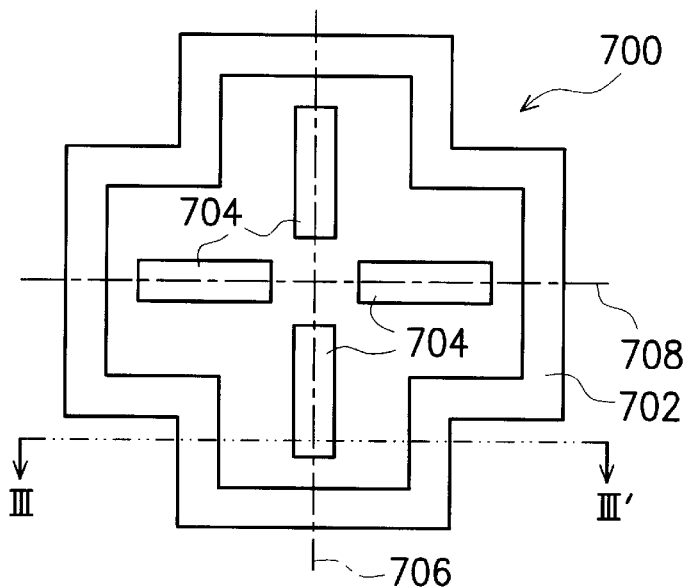
FIG. 7 is a top view of an embodiment of an overlay mark according to the invention.

FIG. 7 is a top view showing an embodiment of an overlay mark provided by the invention.

In FIG. 7, the overlay mark 700 comprises an outer mark 702 and an inner mark 704. The outer mark 702 encloses a closed cross area that further comprises two central axes 706 and 708. The inner mark 704 comprises four strip patterns arranged in the central axes 706 and 708. The four strip patterns extend outwardly in four directions from a central part of the closed cross area. These four strip patterns are neither connected with each other, nor connected with the outer mark 702.

Figure 8:
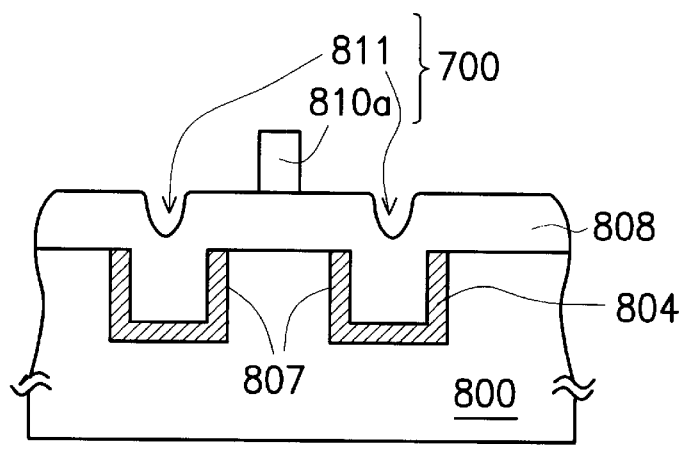
FIG. 8 is a cross-sectional view cutting along the line III-III' showing the overlay mark of FIG. 7.

FIG. 8 shows a cross-sectional view of the overlay mark 300 cutting along the line III-III' of FIG. 7.

Referring to both FIGS. 7 and 8, the outer mark 702 in FIG. 7 corresponds to the recesses 811 in FIG. 8, and the inner mark 704 in FIG. 7 refers to the photoresist pattern 810a in FIG. 8.

In FIG. 8, a substrate 800 including two trenches 807 formed therein is provided. The trenches 807 correspond to a portion of the cross loop trench of the outer mark 702. A conformal metal layer 804 is formed. The material of the conformal layer 804 is suitable for forming plugs such as copper or tungsten. Using chemical mechanical polishing, the metal layer 804 out of the trenches 807 is removed to expose the substrate 800. A metal layer 808 is formed over the substrate 800. As the trenches 807 are wide enough, recesses 811 are formed in the metal layer 808 over the trenches 807. The recesses 811 construct a part of the outer mark 702. A patterned photoresist layer 810a is formed on the metal layer 808 over the substrate 800 between the trenches 807 as a part of the inner mark 704.

Figure 9:
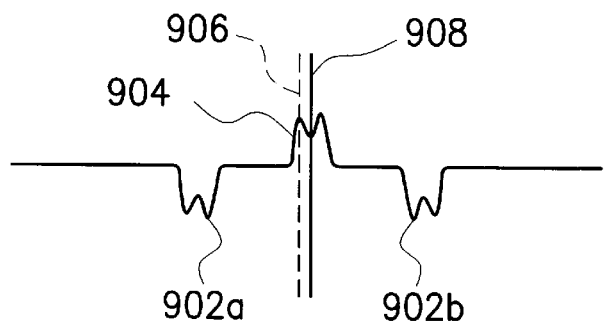
FIG. 9 shows the waveform of the overlay mark as shown in FIG. 8.

FIG. 9 shows the signal waveform measured from the overlay mark as shown in FIG. 8.

Referring to both FIGS. 8 and 9, the peak signals of the recesses 811 are denoted as 902a and 902b, while the peak signal of the photoresist pattern 810a is denoted as 904. While calculating an overlay error in this embodiment, the peak signals 902a and 902b of the recesses 811 are read to obtain a mean value 906 thereof. The mean value 908 of the signal peak signal 904 is read and calculated. The difference between the mean values 906 and 908 is the overlay error. If the overlay error is larger than an acceptable deviation, it means that the alignment between the photoresist pattern and the chip does not have the required accuracy. The photoresist layer has to be removed and the photolithography process has to be repeated until the overlay error is less than the acceptable deviation.

Compared to the conventional rectangular overlay mark, the cross-shaped overlay mark has a better resistance to the chemical mechanical polishing process since the trench distribution density of the overlay mark in the invention is higher.

Figure 10:
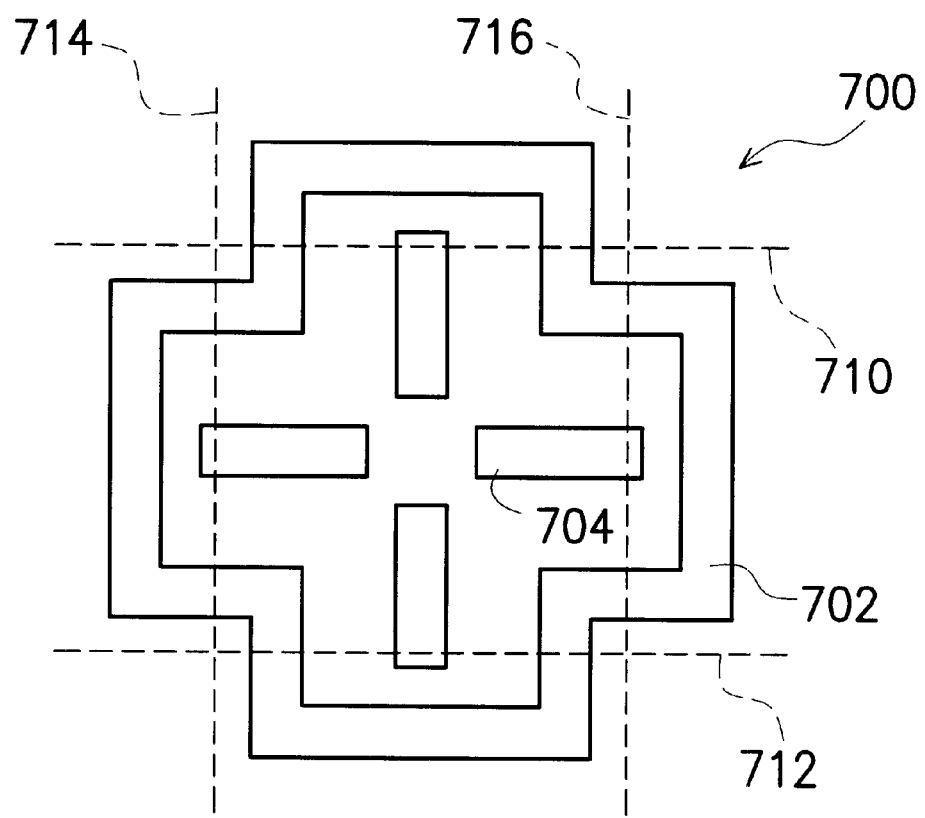
FIG. 10 shows an embodiment of a method for measuring an overlay error according to the invention.

FIG. 10 shows an embodiment of a measurement method of an overlay error according to the invention.

In FIG. 10, the measurement method of overlay error is illustrated. A first X-directional deviation is measured along a first X-directional straight line 710. The first X-directional straight line 710 cuts across a Y-directional extension area of the outer mark 702 and a Y-directional strip pattern of the inner mark 704. A second X-directional deviation is measured along a second X-directional straight line 712 that cuts across the other Y-directional extension area of the outer mark 702 and the other Y-directional strip pattern of the inner mark 704. A first Y-directional deviation is measured along a first Y-directional straight line 714. The first Y-directional straight line 714 cuts across an X-directional extension area of the outer mark 702 and an X-directional strip pattern of the inner mark 704. A second Y-directional deviation is measured along a second Y-directional straight line 716 that cuts across the other X-directional extension area of the outer mark 702 and the other X-directional strip pattern of the inner mark 704.

In the measurement method for the overlay mark of the invention, two deviations of each overlay mark can be measured in the X- or Y-direction. However, the conventional method provides the measurement of only one deviation in the X- or Y-direction. From a statistical point of view, the measurement of the invention is more accurate than the prior art. Furthermore, if the overlay mark of the invention is locally damaged during chemical mechanical polishing, only one of either the X-directional deviation or the Y-directional deviation is required to complete the measurement of the alignment accuracy. In contrast, only one deviation of the overlay mark can be obtained in an X- or Y-direction in the prior art. Consequently, if the overlay mark is partly damaged during chemical mechanical polishing, it is very unlikely that the measurement can be performed in the conventional method.

Figure 11:
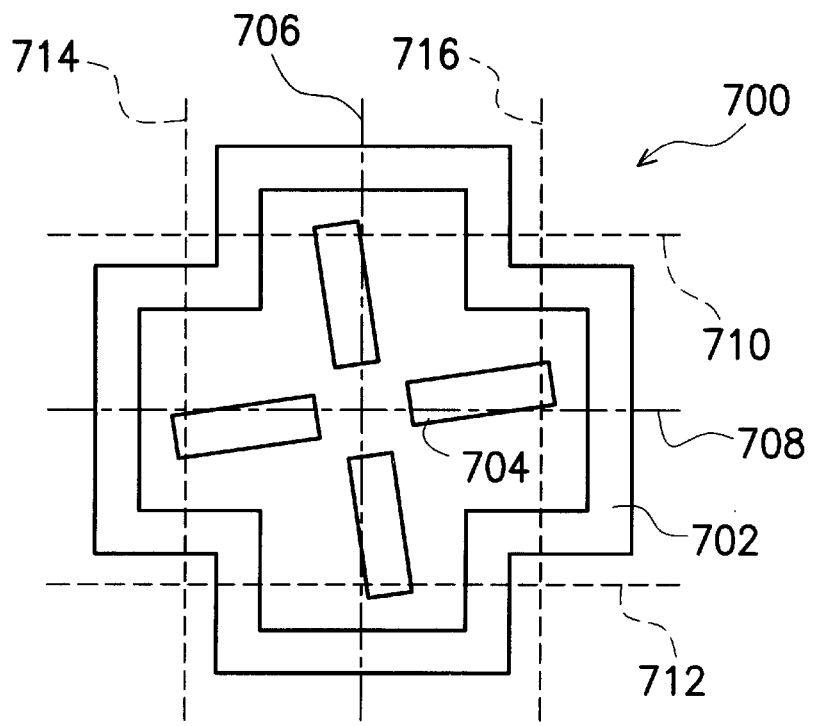
FIG. 11 shows the reticle rotation error using the overlay mark of one single set of the invention.

FIG. 11 shows the overlay mark of which a reticle rotation error can be obtained.

In FIG. 11, the overlay mark 700 is used to analyze the overlay error factors. The measurement method of the overlay error as shown in FIG. 7 is employed. A first X-/Y-directional deviation is measured along the first X-/Y-directional straight line 710/714 of the overlay mark 700, and a second X-/Y-directional deviation is measured along the second X-/Y-directional straight line 712/716 of the overlay mark 700. The X-directional displacement error can be calculated from the average value $A_X$ of the first/second X-directional deviation, and the Y-directional displacement error can be calculated from the average value $A_Y$ of the first/second Y-directional deviation. From the difference between $A_X$ and the first and second X-directional deviations (or plus the difference between $A_Y$ and the first and second Y-directional deviations), the reticle rotation error can be obtained. Thus, the overlay mark of the invention requires only one overlay mark to obtain the reticle rotation error.

Figure 12:
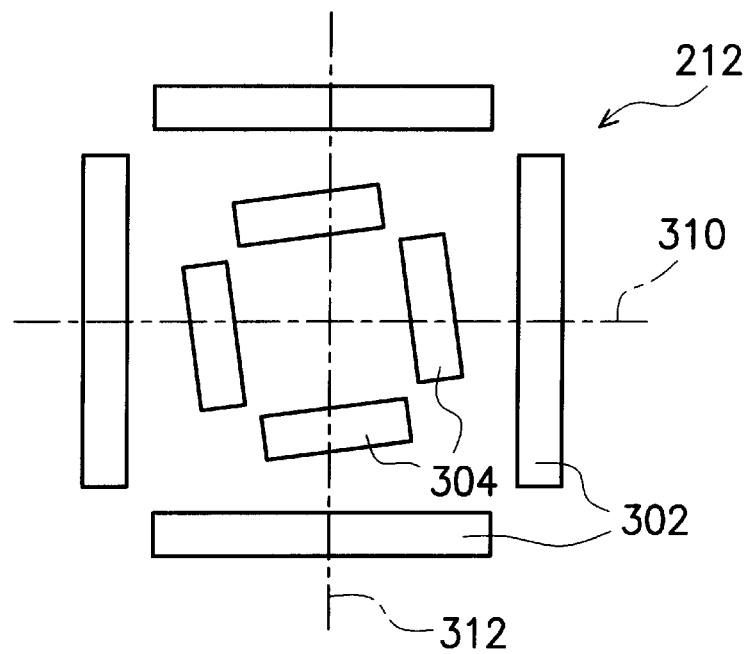
FIG. 12 shows that the conventional method cannot obtain the reticle rotation error by using only one single set, a plurality of overlay mark sets with different positions has to be provided in order to obtain the reticle rotation error.

FIG. 12 shows that it is not able to obtain the reticle rotation error using the conventional overlay mark.

In FIG. 12, as the measuring machine measures the area with a fixed width for the measurement of the conventional overlay mark to analyze the overlay error factors, only one X- and one Y-directional deviations are obtained from the straight lines 310 and 312. However, only the displacement error can be obtained from one X- and one Y-directional deviation, and the reticle rotation error cannot be obtained. Therefore, if the conventional overlay mark is used to obtain the reticle overlay mark, another X- and Y-directional deviations of the overlay mark are required.

According to the above, the invention has the following advantages:

1. The overlay mark of the invention includes a reinforced structure that can withstand chemical mechanical polishing effectively, especially for interconnection fabrication process. As a result, the probability of damage caused by chemical mechanical polishing is reduced.

2. The accuracy of the measured overlay error is enhanced while using the overlay mark and the measurement method provided by the invention.

3. Only one overlay mark is required to obtain the reticle rotation error.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. An overlay mark structure, comprising:
   an outer mark, comprising a trench in a substrate surrounding a closed cross area comprising two central axes; and
   an inner mark, comprising four strip patterns arranged along the central axes and extending outwardly in four directions from a central part of the closed cross area.

2. The overlay mark structure according to claim 1, wherein the four strip patterns are not connected to each other.

3. The overlay mark structure according to claim 1, wherein the four strip patterns are not connected to the outer mark.

4. The overlay mark structure according to claim 1, wherein the substrate includes a dielectric layer, and the trench is in the dielectric layer.

5. The overlay mark structure according to claim 4, further comprising a metal layer under the dielectric layer under the trench.

6. The overlay mark structure according to claim 5, wherein the conformal metal layer is selected from a group consisting copper or tungsten.

7. The overlay mark structure according to claim 1, wherein the inner mark includes a protrusion structure.

8. The overlay mark structure according to claim 7, wherein the inner mark is made of a photoresist material.

9. A method of measuring an overlay error, comprising:

providing an overlay mark, comprising an outer mark and an inner mark, wherein the outer mark comprises a trench in a substrate surrounding a closed cross area with two central axes extending towards X-/Y-directions, and the inner mark arranged along the central axes comprises two X-directional strip patterns and two Y-directional strip patterns extending outwardly from a central part of the closed cross area;

measuring a first X-directional deviation along a first X-directional straight line, wherein the firs X-directional straight line cuts across a Y-directional extension area of the closed cross area and one of the Y-directional strip patterns; and measuring a first Y-directional deviation along a first Y-directional straight line, wherein the first Y-directional straight line cuts across an X-directional extension area of the closed cross area and one of the X-directional strip patterns.

10. The method according to claim 9, further comprising measuring a second X-directional deviation along a second X-directional straight line, wherein the second X-directional straight line cuts across the other Y-directional extension area of the closed cross area and the other Y-directional strip patterns to obtain an average X-directional deviation of the first and the second X-directional deviations.

11. The method according to claim 9, further comprising measuring a second Y-directional deviation along a second Y-directional straight line, wherein the second Y-directional straight line cuts across the other X-directional extension area of the closed cross area and the other X-directional strip patterns to obtain an average Y-directional deviation of the first and the second Y-directional deviations.

12. A method of analyzing an overlay error, comprising:

providing an overlay mark, providing an overlay mark, which comprises an outer mark and an inner mark, wherein the outer mark comprises a trench in a substrate surrounding a closed cross area with two central axes extending in X-/Y-directions, and the inner mark arranged along the central axes comprises two X-directional strip patterns and two Y-directional strip patterns extending outwardly from a central part of the closed cross area;

measuring a first X-directional deviation along a first X-directional straight line, wherein the first X-directional straight line cuts across a Y-directional extension area of the closed cross area and one of the Y-directional strip patterns;

measuring a second X-directional deviation along a second X-directional straight line, wherein the second X-directional deviation cuts across another Y-directional extension area of the closed cross area and other Y-directional strip patterns;

measuring a first Y-directional deviation along a first Y-directional straight line, wherein the Y-directional straight line cuts across an X-directional extension area of the closed cross area and one of the X-directional strip patterns; and measuring a second Y-directional deviation along a second Y-directional straight line, wherein the second Y-directional straight line cuts across another X-directional extension area of the closed cross area and other X-directional strip patterns.

13. The method according to claim 12, wherein the overlay error factors comprise displacement error and reticle rotation error.

* * * * *